United States Patent
Kostinsky et al.

(10) Patent No.: US 9,026,725 B2
(45) Date of Patent: May 5, 2015

(54) TRAINING FOR COMMAND/ADDRESS/CONTROL/CLOCK DELAYS UNDER UNCERTAIN INITIAL CONDITIONS AND FOR MAPPING SWIZZLED DATA TO COMMAND/ADDRESS SIGNALS

(71) Applicant: Intel Corporation, Santa Clara, CA (US)

(72) Inventors: Alexey Kostinsky, Nahariya (IL); Zvika Greenfield, Kfar Sava (IL); Christopher P. Mozak, Beaverton, OR (US); Pavel Konev, Haifa (IL); Olga Fomenko, Netanya (IL)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 13/728,581

(22) Filed: Dec. 27, 2012

(65) Prior Publication Data

US 2014/0189224 A1 Jul. 3, 2014

(51) Int. Cl.
*G11C 7/10* (2006.01)
*G11C 7/20* (2006.01)
*G11C 11/4072* (2006.01)
*G11C 29/02* (2006.01)

(52) U.S. Cl.
CPC ............ *G11C 7/1072* (2013.01); *G11C 7/1063* (2013.01); *G11C 7/20* (2013.01); *G11C 11/4072* (2013.01); *G11C 2207/105* (2013.01); *G11C 2207/2254* (2013.01); *G11C 29/023* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 2003/0026162 A1* | 2/2003 | Matsui | 365/233 |
| 2004/0267489 A1 | 12/2004 | Reblewski et al. | |
| 2007/0005836 A1* | 1/2007 | Jain et al. | 710/62 |
| 2009/0019323 A1 | 1/2009 | Porterfield | |
| 2011/0153925 A1 | 6/2011 | Bains et al. | |
| 2012/0198135 A1 | 8/2012 | Chilappagari et al. | |
| 2012/0250433 A1* | 10/2012 | Jeon | 365/193 |

FOREIGN PATENT DOCUMENTS

WO WO-2012064670 5/2012

OTHER PUBLICATIONS

International Search Report & Written Opinion for International Application No. PCT/US2013/046406 Mailed Nov. 8, 2013, 10 pages.

* cited by examiner

*Primary Examiner* — Kaushikkumar Patel
(74) *Attorney, Agent, or Firm* — Blakely, Sokoloff, Taylor & Zafman LLP

(57) ABSTRACT

Data pin mapping and delay training techniques. Valid values are detected on a command/address (CA) bus at a memory device. A first part of the pattern (high phase) is transmitted via a first subset of data pins on the memory device in response to detecting values on the CA bus; a second part of the pattern (low phase) is transmitted via a second subset of data pins on the memory device in response to detecting values on the CA bus. Signals are sampled at the memory controller from the data pins while the CA pattern is being transmitted to obtain a first memory device's sample (high phase) and the second memory device's sample (low phase) by analyzing the first and the second subset of sampled data pins. The analysis combined with the knowledge of the transmitted pattern on the CA bus leads to finding the unknown data pins mapping. Varying the transmitted CA patterns and the resulting feedbacks sampled on memory controller data signals allows CA/CTRL/CLK signals delay training with and without priory data pins mapping knowledge.

21 Claims, 10 Drawing Sheets

Pattern A:

|  |  | CA-1 High | CA-1 Low | Target CA High | Target CA Low | CA+1 High | CA+1 Low |
|---|---|---|---|---|---|---|---|
| Chip Select | | Off | | On | | Off | |
| Sum of fed back '1'-s/phase | | 1+1=2 | | 2+2=4 | | 3+3=6 | |
| Mapped to Byte X | CA0 | 0 | 0 | 1 | 1 | 1 | 1 |
| | CA1 | 0 | 0 | 0 | 1 | 1 | 1 |
| | CA2 | 0 | 0 | 0 | 0 | 1 | 1 |
| | CA3 | 1 | 1 | 1 | 0 | 0 | 0 |
| CA4 (irrelevant) | | 0 | 0 | 0 | 0 | 0 | 0 |
| Mapped to Byte Y | CA5 | 0 | 0 | 1 | 1 | 1 | 1 |
| | CA6 | 0 | 0 | 0 | 1 | 1 | 1 |
| | CA7 | 0 | 0 | 0 | 0 | 1 | 1 |
| | CA8 | 1 | 1 | 1 | 0 | 0 | 0 |
| CA9 (irrelevant) | | 0 | 0 | 0 | 0 | 0 | 0 |

Pattern B ('inversed' A):

|  |  | CA-1 High | CA-1 Low | Target CA High | Target CA Low | CA+1 High | CA+1 Low |
|---|---|---|---|---|---|---|---|
| Chip Select | | Off | | On | | Off | |
| Sum of fed back '1'-s/phase | | 3+3=6 | | 2+2=4 | | 1+1=2 | |
| Mapped to Byte X | CA0 | 1 | 1 | 1 | 1 | 0 | 0 |
| | CA1 | 1 | 1 | 1 | 0 | 0 | 0 |
| | CA2 | 1 | 1 | 0 | 0 | 0 | 0 |
| | CA3 | 0 | 0 | 0 | 1 | 1 | 1 |
| CA4 (irrelevant) | | 0 | 0 | 0 | 0 | 0 | 0 |
| Mapped to Byte Y | CA5 | 1 | 1 | 1 | 1 | 0 | 0 |
| | CA6 | 1 | 1 | 1 | 0 | 0 | 0 |
| | CA7 | 1 | 1 | 0 | 0 | 0 | 0 |
| | CA8 | 0 | 0 | 0 | 1 | 1 | 1 |
| CA9 (irrelevant) | | 0 | 0 | 0 | 0 | 0 | 0 |

FIG. 3

TRAINING FOR COMMAND/ADDRESS/CONTROL/CLOCK DELAYS UNDER UNCERTAIN INITIAL CONDITIONS AND FOR MAPPING SWIZZLED DATA TO COMMAND/ADDRESS SIGNALS

TECHNICAL FIELD

Embodiments of the invention relate to training of memory links. More particularly embodiments of the invention relate to techniques for automatically mapping swizzled data.

BACKGROUND

When memory training begins on a platform with poorly aligned Control, Clock and Command/Address (CA) signals, even the most basic commands, such as Reset or entry into CA Training mode, might not register correctly in some of the DRAM devices. Current solutions demand very strict length matching and/or manual initial timing settings for all these signal types for each problematic platform. As a result, much time and efforts can be spent for just enabling the most basic training routines to run.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 illustrates two training patterns that may be used.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Low-Power DDR-3 (LPDDR-3 per JEDEC specification JESD209-3) command/address (CA) training mode and mode register readout (MRR) require specific data (DQ) pin mapping if there is swapping on the board. Not allowing swapping on the board restricts options to system designers and manufacturers by limiting product options and increasing design complexity. For example, mapping of all 128 DQ pins for a typical two-channel LPDDR3 embodiment would require significant human effort and may result in errors. It may also require a custom BIOS/MRC (Memory Reference Code) version for each board and for each memory configuration option, resulting in complex production environments and complex production management issues. Techniques described herein can determine the mapping of required signals automatically using memory device training modes. For example, the CA training mode for LPDDR3, and other similar training modes. In one embodiment, the mapping technique uses a byte mapping (e.g., 8 bits per 64-bit channel), which can eliminate monotonous manual labor and the corresponding probability of errors, as well as allowing a universal BIOS version to work with many different boards/platforms without the need to recompile the BIOS.

In one embodiment, when performing CA training, memory devices sample the CA bus values and return feedback on the DQ pins. The memory controller and any training support mechanisms (e.g., software, firmware) can analyze the feedback and determine a next action. Due to an unknown DQ mapping, there is no immediate way for the memory controller to determine which input is routed to which memory data line.

Figure 1:
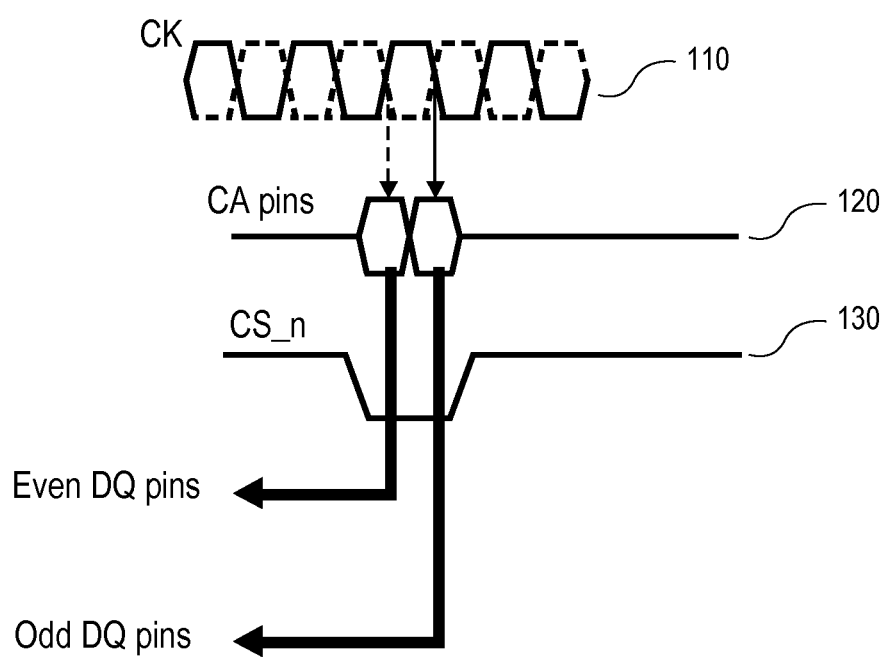
FIG. 1 is a timing diagram corresponding to one embodiment of a training technique for mapping of data lines.

FIG. 1 is a timing diagram corresponding to one embodiment of a training technique for mapping of data lines. In one embodiment, mapping of data pins is split in to even and odd training. In other embodiments, other splits or groupings can be used.

In one embodiment, clock signal 110 is used to drive transactions on the CA bus 120 and the data bus. In one embodiment, the CA High phase values map to the even memory data outputs (e.g., DQ0, DQ2, DQ4) and the CA Low phase values map to the odd memory data outputs (e.g., DQ1, DQ3, DQ5).

In one embodiment, transmitting a single CA phase with a value different from all other CA pins and the second phase of the same pin will result in a single data signal having a value different than the other pins (e.g., one of 16 pins are high). Cycling through the position of the single differing value allows the training mechanism to identify one data pin at a time and generate an appropriate mapping in a more efficient manner than possible using prior art techniques.

To achieve a faster mapping, for example, eight iterations rather than 16 for 16 pins, a different CA phase per each four pins can be used. For example to find data pin 0 (DQ0) in Byte 0 and data pin 8 (DQ8) in Byte 1, a value of "1" can be transmitted on CA0 and CA5 high phases, while CA0 and CA5 low phases and all other CA pins transmit "0". This results in a single "1" value on each DQ byte that provides feedback (lower two bytes of the memory device). The training mechanism then finds which single DQ pin in each byte has the value of "1" and stores that information for mapping and subsequent deswizzling.

In one embodiment, the following CA to DQ mapping may be utilized:

| CA0 | CA1 | CA2 | CA3 | CA5 | CA6 | CA7 | CA8 | Clock Edge |
|---|---|---|---|---|---|---|---|---|
| DQ0 | DQ2 | DQ4 | DQ6 | DQ8 | DQ10 | DQ12 | DQ14 | Rising |
| DQ1 | DQ3 | DQ5 | DQ7 | DQ9 | DQ11 | DQ13 | DQ15 | Falling |

Previous DDR generations did not require signal mapping as described above. Common solutions for the LPDDR3 need for signal mapping included, for example, hardcoded tables with mapping data, which is an inefficient solution for a large number of board variations and/or memory configurations.

Another existing (ineffective) solution is to disallow swapping DQ signals and bytes completely to avoid this—but it makes board design very ineffective and complex.

In one embodiment, techniques described herein provide a training mechanism for concurrent initial pre-training of Control, Clock, Command and Address signals timings for memory devices (e.g., LPDDR3). These mechanisms utilize a training mode, for example, the LPDDR3 Command/Address (CA) Training mode, with unique training patterns that do not require prior Command/Address or Control signals training.

In one embodiment, while in CA Training mode, memory devices sample a single transaction on CA bus and provide feedback on the DQ signals. The CA0 . . . CA3 pins values on both High and Low phase map to DQ0 . . . 7 outputs of each memory device (1st byte), while CA5 . . . 8 High and Low phase values map to DQ8 . . . 15 outputs of each memory device (2nd byte).

Because there is no complete DQ mapping at this point of training, a preselected pattern is transmitted on CA bus that does not rely on checking the exact DQ feedback, but the sum of signals equal to "1" in each data byte. In one embodiment, the pattern includes all the CA bus transitions to ensure coverage of both High and Low phase, while not producing excessive stress by having only one level transition from 0 to 1 or from 1 to 0) per signal during each iteration.

Figure 2:
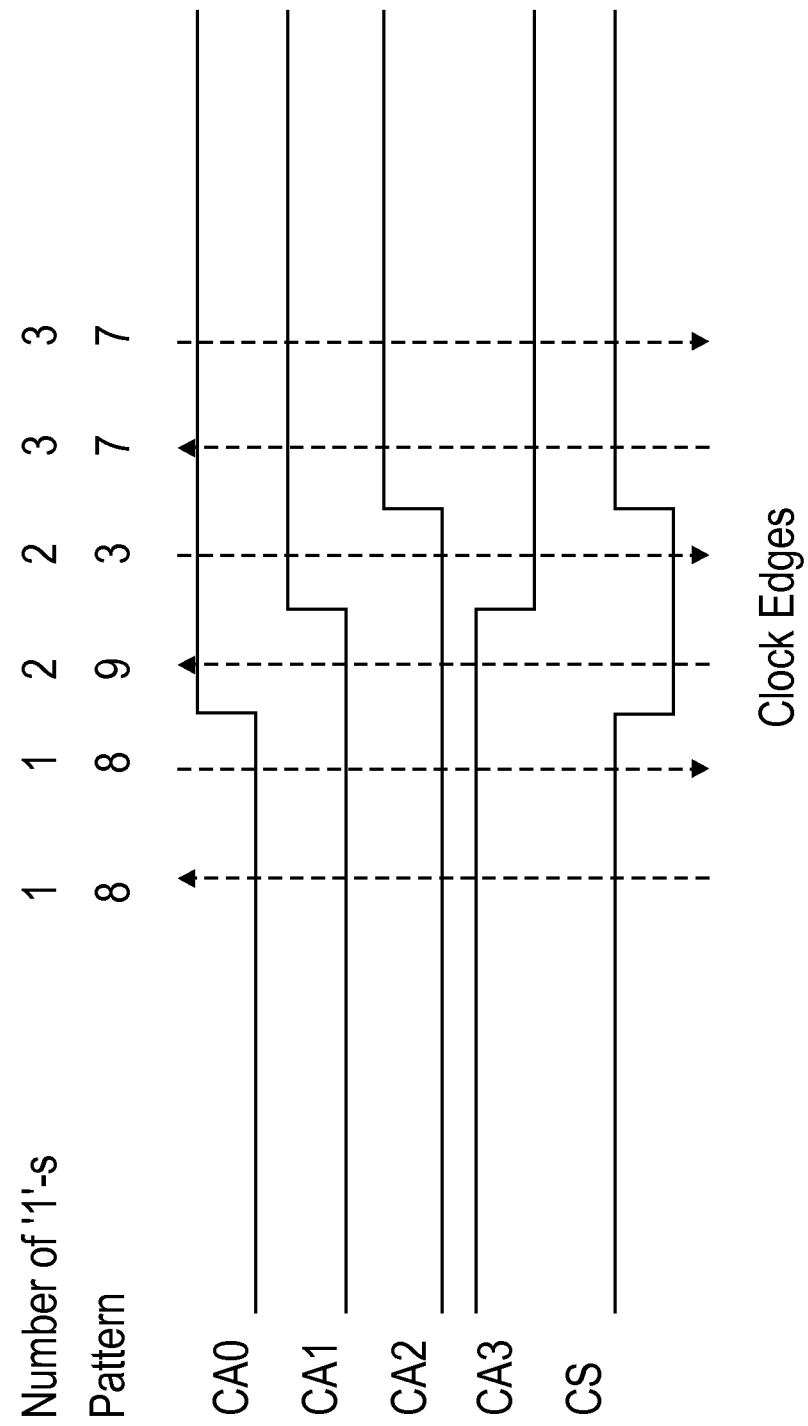
FIG. 2 is one embodiment of a timing diagram for a training sequence.

FIG. 2 is one embodiment of a timing diagram for a training sequence. In one embodiment, on each of the CA pins (e.g., CA0 . . . 3 and CA5 . . . 8), the following pattern is transmitted (or its opposite/inversed version, as described below).

As a result, a different feedback will arrive on the DQ pins, depending on Chip Select (Control) and CA relative timings versus the clock signal for each memory device. If both CS 130 and CA 120 are aligned correctly with respect to the clock signal, both clock phases will sample two CA pins with value of "1" and another two with the value of "0," resulting in four DQ pins with the value of "1."

If either or both CA and CS buses are unaligned, incorrect values ranging from two to six DQ pins sampled at "1" (exact values do not matter). This allows the ability also distinguish the case of sample 0 or 1 on all the DQ pins, meaning the memory device is not in CA Training mode.

If the DRAM device does not sample anything, it keeps the feedback on the DQ pins constant, thus resulting in displaying an old, irrelevant feedback to the memory controller. That is why we want to find out this is the case. In one embodiment, in order to distinguish lack of sample (e.g., due to marginal/incorrect timing) from a correct timing, two unique inversed patterns can be used that both result in four "1"s if sampled correctly, but with different signatures. Therefore, each valid point should sample "4" with two different signatures. Any other result is considered as failing point. FIG. 3 illustrates two training patterns that may be used. Patterns of similar kind and similar characteristics will achieve the same results. In one embodiment, the patterns are chosen in a way that the signature of the second pattern sampled on data signals should be an inversed copy of the signature of the first pattern to ease the indication of which pins are not producing the desired results and to speed up the debugging process.

In one embodiment specific to LPDDR-3 and related implementations, because the initial Clock/CTRL/CA timings might be invalid, there is no way to guarantee the initial Reset/Init and CA Training mode entry commands are decoded correctly. In one embodiment, in order to guarantee the Reset command success (e.g., MRW63 command), the CS signal can be transmitted for two consecutive cycles ("2N CS" mode).

At this point, all the MR (DRAM internal Mode Register) values necessary are not yet available for LPDDR operation, but these values are not required yet. In one embodiment, the only MRW needed is CA Training mode entry (e.g., MRW41), which might or might not succeed due to Clock/CTRL timing. Therefore, for the iterations that show incorrect results, if there indications that the memory device is not in CA training mode, the CA Training mode is exited (in case some of DRAM devices on this rank are in it but others not), reset the rank and enter the CA Training mode again.

Before any other memory device training steps can begin, the MRC must make sure the Control signals are aligned at all the memory (e.g., DRAM) devices, so all the issued commands register correctly. Because not all these signals have matching lengths on some platforms due to design limitations and/or errors, there is a need for mechanism to find the optimal timings for these signals.

Described herein are techniques for training Control signals timings that are particularly useful for LPDDR3; however, other memory devices can also be supported. In LPDDR3 embodiments, these techniques utilize the LPDDR3 Command/Address (CA) Training mode and uses special training patterns that do not require prior Command/Address signals training. In other embodiments, similar training modes can be used similarly for training Control signal timing.

In one embodiment, The technique sweeps the Control delay across the range and for each value transmits both patterns (see FIG. 3) and compares the read DQ results for each byte among themselves (should be different for the two patterns) and the sum of values for each byte to four.

After the test finishes, the middle point of the period that had valid points is chosen and set to Control pins. In one embodiment, the test is repeated for each populated rank on all the populated channels in parallel.

Current solutions rely on more precise signals length matching, which can be easier to achieve and/or less of an issue at slower speeds and on physically larger system boards. If a mismatch occurred, manual adjustments are made to the timings for each case. This complicates boards power-on activities and demands separate BIOS builds for each such board.

Additionally, functional Control training steps are added per need, which run at much later MRC stage (after all the other signal timings are already tuned). As a result, if the initial Control timing settings were marginal, the systems become less stable and might not even reach this advanced step without manual tuning of the initial timing settings.

Figure 4:
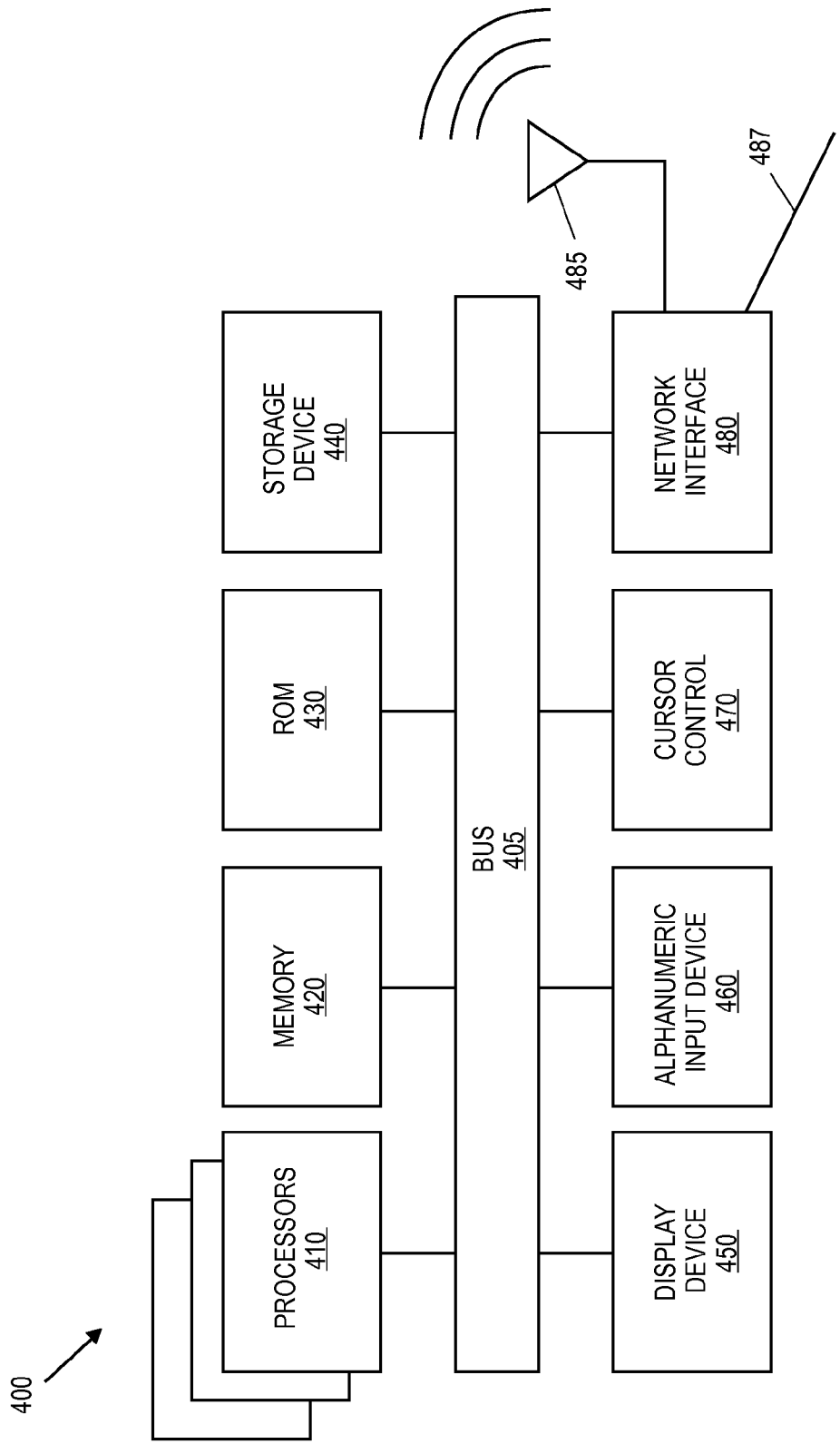
FIG. 4 is a block diagram of one embodiment of an electronic system.

FIG. 4 is a block diagram of one embodiment of an electronic system. The electronic system illustrated in FIG. 4 is intended to represent a range of electronic systems (either wired or wireless) including, for example, desktop computer systems, laptop computer systems, cellular telephones, personal digital assistants (PDAs) including cellular-enabled PDAs, set top boxes, tablets, etc. Alternative electronic systems may include more, fewer and/or different components.

Electronic system 400 includes bus 405 or other communication device to communicate information, and processor 410 coupled to bus 405 that may process information. While electronic system 400 is illustrated with a single processor, electronic system 400 may include multiple processors and/or co-processors. Electronic system 400 further may include random access memory (RAM) or other dynamic storage device 420 (referred to as main memory), coupled to bus 405 and may store information and instructions that may be executed by processor 410. Main memory 420 may also be used to store temporary variables or other intermediate information during execution of instructions by processor 410.

Electronic system 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled to electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate direction information and command selections to processor 410 and to control cursor movement on display 450.

Electronic system 400 further may include network interface(s) 480 to provide access to a network, such as a local area network. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface(s) 480 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Figure 5:
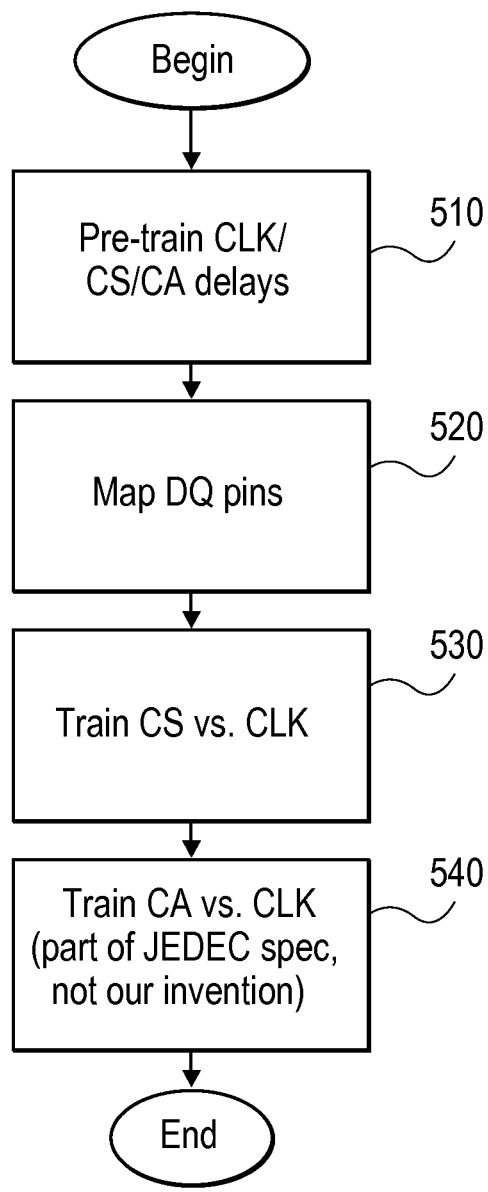
FIG. 5 is a flow diagram of one embodiment of a training sequence that can be utilized in the system of FIG. 4.

FIG. 5 is a flow diagram of one embodiment of a training sequence that can be utilized in the system of FIG. 4. The training sequence of FIG. 5 provides a general overview of the training process.

Pre-training is performed for the CLK/CS/CA delays, 510. Embodiments for CLK/CS/CA pre-training are described herein. The data (DQ) pins are mapped, 520. Mapping of the DQ pins is performed as described herein. CS vs. CLK training is performed, 530. CS vs. CLK training is performed as described herein. CA vs. CLK training is performed, 540. The CA vs. CLK training can be performed in any manner known in the art.

Figure 6:
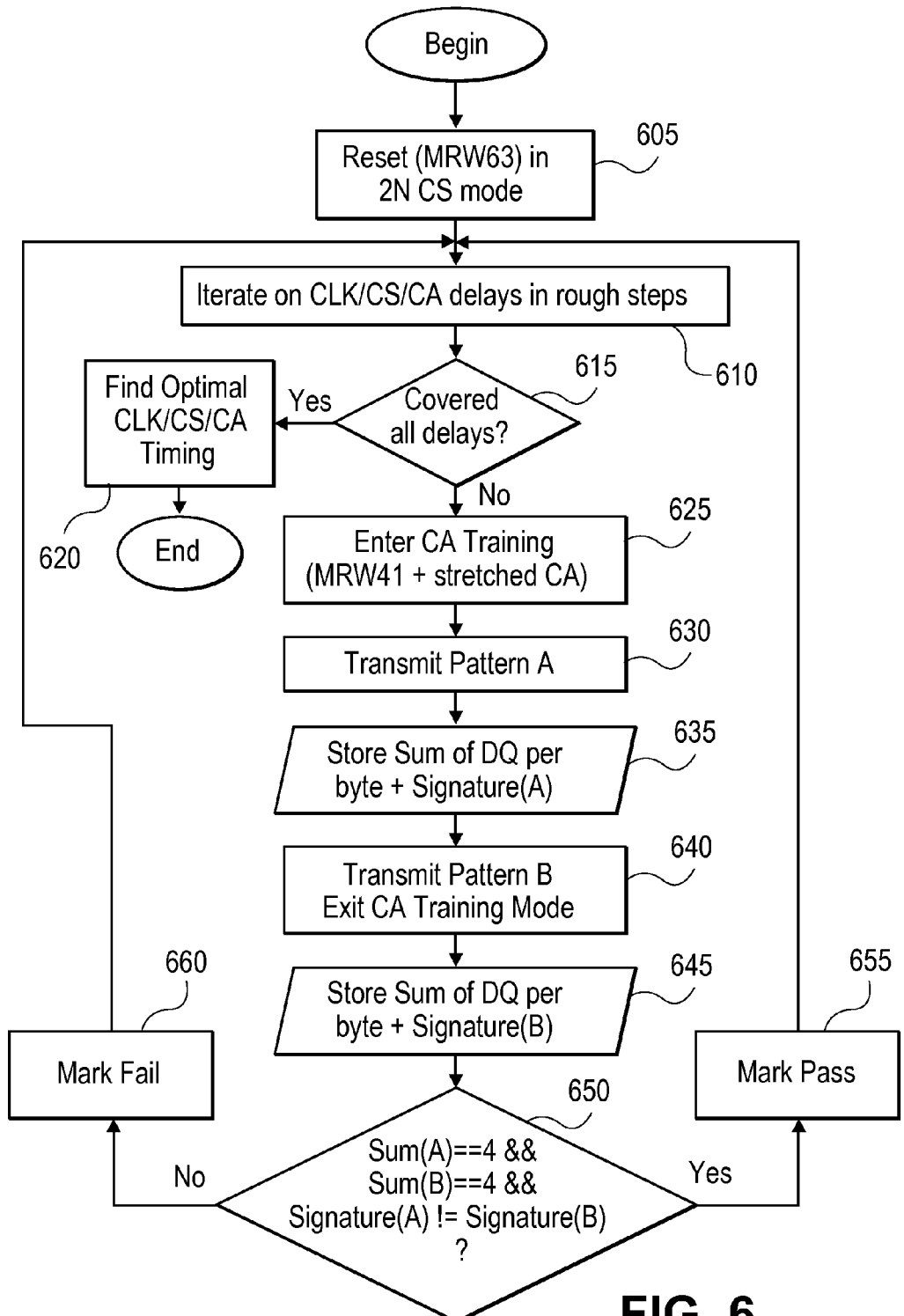
FIG. 6 is a flow diagram of one embodiment of a pre-training procedure for CLK/CS/CA delays.

FIG. 6 is a flow diagram of one embodiment of a pre-training procedure for CLK/CS/CA delays. FIG. 6 provides a simplified version of the pre-training procedure for CLK/CS/CA delays as compared to the version of FIG. 7. The example of FIG. 6 relates to a LP-DDR3 configuration; however, the concepts described can be applicable to other DDR technologies and to non-DDR configurations as well. The host system is reset in 2N CS mode (e.g., MRW63 command), 605.

The system iterates on the CLK/CS/CA delays in rough steps, 610 to reduce run/boot time. If all of the delays are covered, 615, the system can operate to find optimal timing for the CLK/CS/CA signals, 620. If all of the delays are not covered, 615, the system enters CA training, 625. In one embodiment, CA training is entered with the MRW41 command and stretched CA; however, other techniques can be used for other configurations (e.g., non-LPDDR3).

A first pattern (e.g., Pattern A, FIG. 3) is transmitted, 630. In one embodiment, the sum of the data bits, per byte corresponding to the first pattern is calculated and stored with a signature value for the first pattern, 635. A second pattern (e.g., Pattern B, FIG. 3) is transmitted and the CA training mode is exited, 640. In one embodiment, the sum of the data bits, per byte corresponding to the second pattern is calculated and stored with a signature value for the second pattern, 645.

The pattern results are compared, 650, to determine whether the current timing parameters have passed, 655, or failed, 660. In one embodiment, the results comparison involves checking the number of '1' bits received for each training pattern. In one embodiment, if each pattern results in four '1' bits received and the signatures for the two patterns are different, the pattern training has passed.

Figure 7:
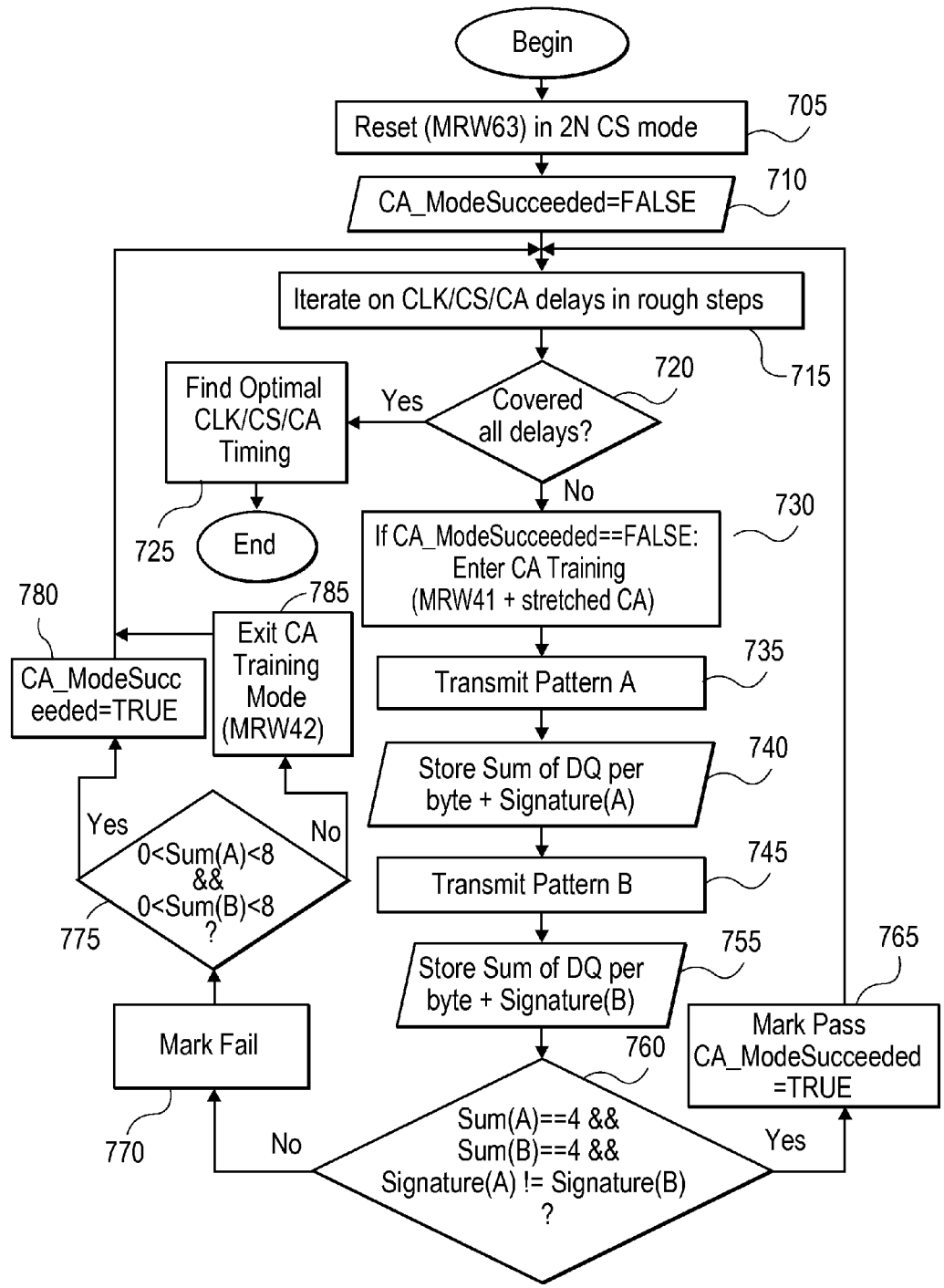
FIG. 7 is a flow diagram of one embodiment of a pre-training procedure for CLK/CS/CA delays.

FIG. 7 is a flow diagram of one embodiment of a pre-training procedure for CLK/CS/CA delays. FIG. 7 provides a more complex version of the pre-training procedure for CLK/CS/CA delays as compared to the version of FIG. 6. The example of FIG. 7 relates to a LP-DDR3 configuration; however, the concepts described can be applicable to other DDR technologies and to non-DDR configurations as well. The host system is reset in 2N CS mode (e.g., MRW63 command), 705.

The CA_ModeSucceeded flag is set to FALSE, 710. The system iterates on the CLK/CS/CA delays in rough steps, 715. If all of the delays are covered, 720, the system can operate to find optimal timing for the CLK/CS/CA signals, 725. If all of the delays are not covered, 720, if the CA_ModeSucceeded is still FALSE, the system enters CA training, 730. In one embodiment, CA training is entered with the MRW41 command and stretched CA; however, other techniques can be used for other configurations (e.g., non-LPDDR3).

A first pattern (e.g., Pattern A, FIG. 3) is transmitted, 735. In one embodiment, the sum of the data bits, per byte corresponding to the first pattern is calculated and stored with a signature value for the first pattern, 740. A second pattern (e.g., Pattern B, FIG. 3) is transmitted and the CA training mode is exited, 745. In one embodiment, the sum of the data bits, per byte corresponding to the second pattern is calculated and stored with a signature value for the second pattern, 755.

The pattern results are compared, 760, to determine whether the current timing parameters have passed, 765, or failed, 770. In one embodiment, the results comparison involves checking the number of '1' bits received for each training pattern. In one embodiment, if each pattern results in four '1' bits received and the signatures for the two patterns are different, the pattern training has passed.

When the results indicate a pass, the CA_ModeSucceeded is marked TRUE, 765. When the results indicate a fail, if the sum of bits for both patterns is greater than 0 and less than 8, 775, the CA_ModeSucceeded flag is marked TRUE, 780. If the sum for both patterns is not greater than 0 and less than 8, CA training mode is exited (e.g., with MRW42 command), 785. Marking CA_ModeSucceeded with the value of TRUE indicates that in the past all the DRAMs have reached the CA Training mode at the same iteration and remain in this mode since then, eliminating the need to exit and enter CA Training mode during every consecutive iteration, thus saving run time. Any other method of indication of CA Training mode entry success will yield similar results. The way to ensure reaching CA Training mode is discovering the DRAMs react on the different patterns on the CA bus transmitted to them, as opposed to being stuck at some default value.

The following flow description corresponds to one embodiment of a technique for training CA/CS/CLK pins on a memory device.

1. Begin:
2. Reset memory device (e.g., MRW63) in 2N mode
3. Set CLK, CS, CA delay values (loop)
   a. Enter CA Training mode (if needed)
   b. Transmit pattern A
   c. Store Result+signature
   d. Option:
      i. check for number of '1'-s
         1. if 0 or 8
            a. mark as failing point
            b. exit CA training mode (e.g., MRW42)
            c. jump to 3, update delay values and continue again through CA Training
         2. if <4 or >4,
            a. mark as failing point
            b. jump to 3 but skip a.
         3. if ==4—continue
   e. Transmit pattern B
   f. Check for number of '1'-s
      i. if 0 or 8
         1. mark as failing point
         2. exit CA training mode (e.g., MRW42)
         3. jump to 3, update delay values and continue again through CA Training
      ii. if <4 or >4 or ==4 but signature is the same as for A:
         1. mark as failing point
         2. jump to 3 (update delays) but skip a.
      iii. if ==4 and signature is different from A's—mark as passing point.
   (After all the delay values are tried)
4. Decide on optimal delay point to be located in the middle of the largest passing points region.

Figure 8:
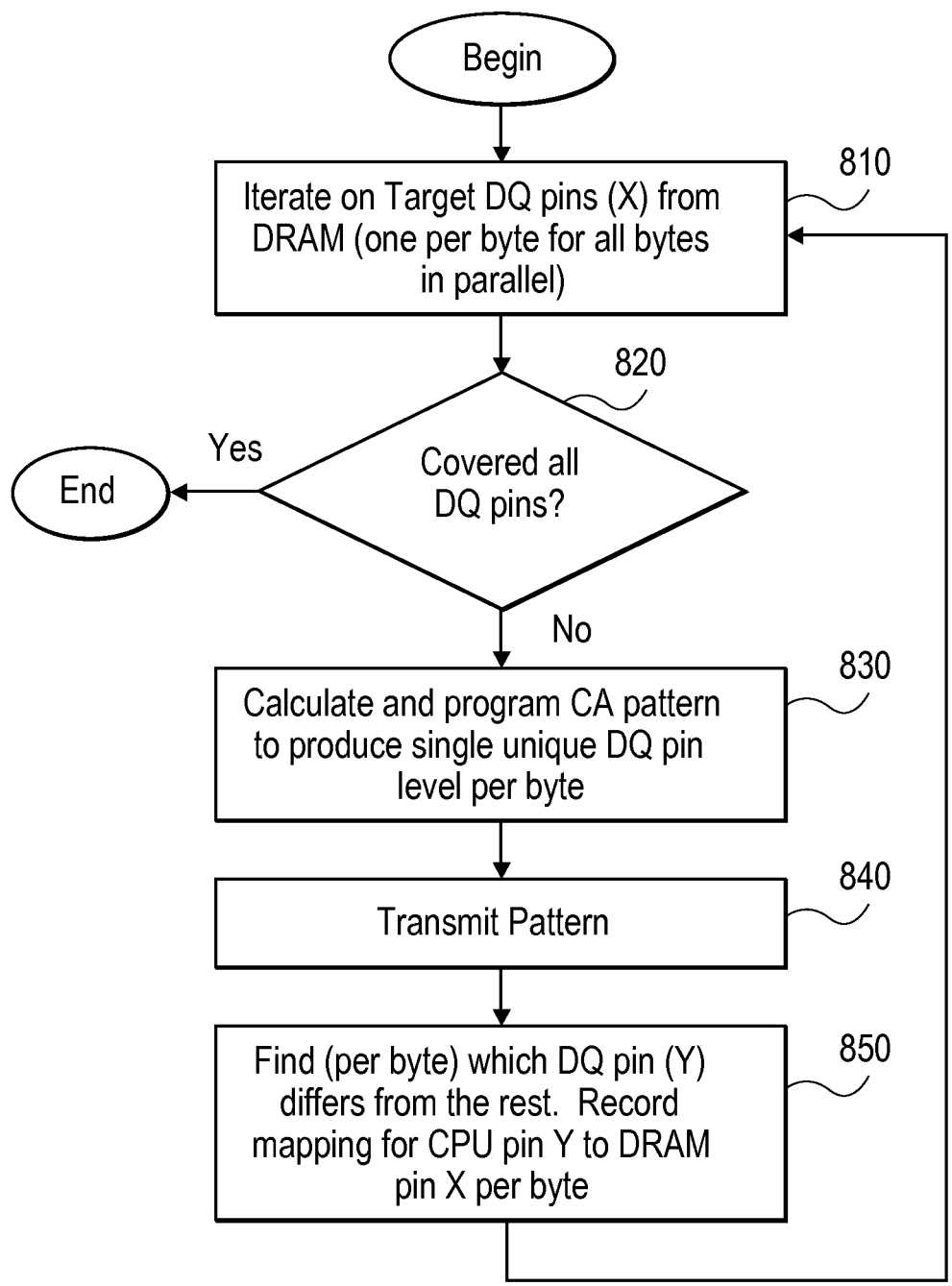
FIG. 8 is a flow diagram of one embodiment of data pin mapping that can be used after pre-training.

FIG. 8 is a flow diagram of one embodiment of data pin mapping that can be used after pre-training described on FIGS. 6 and 7. In one embodiment, a known bit pattern (e.g., one '1' per byte) is iterated through from memory (e.g., DRAM), 810. In one embodiment, the pattern is performed for each byte in all bytes of a line in parallel.

If all of the data pins are covered, 820, mapping is complete. If all of the data pins are not covered, 820, then a CA pattern to produce a single unique data pin level per byte is calculated and programmed, 830. The pattern is transmitted to memory, 840. In one embodiment, the DQ pins are scanned to find the data pin that differs from the other data pins on a per-byte basis. Other sizes can also be supported. This mapping is recorded for the processor (e.g., CPU) or other component to be mapped to the data pin asserted above 850.

Figure 9:
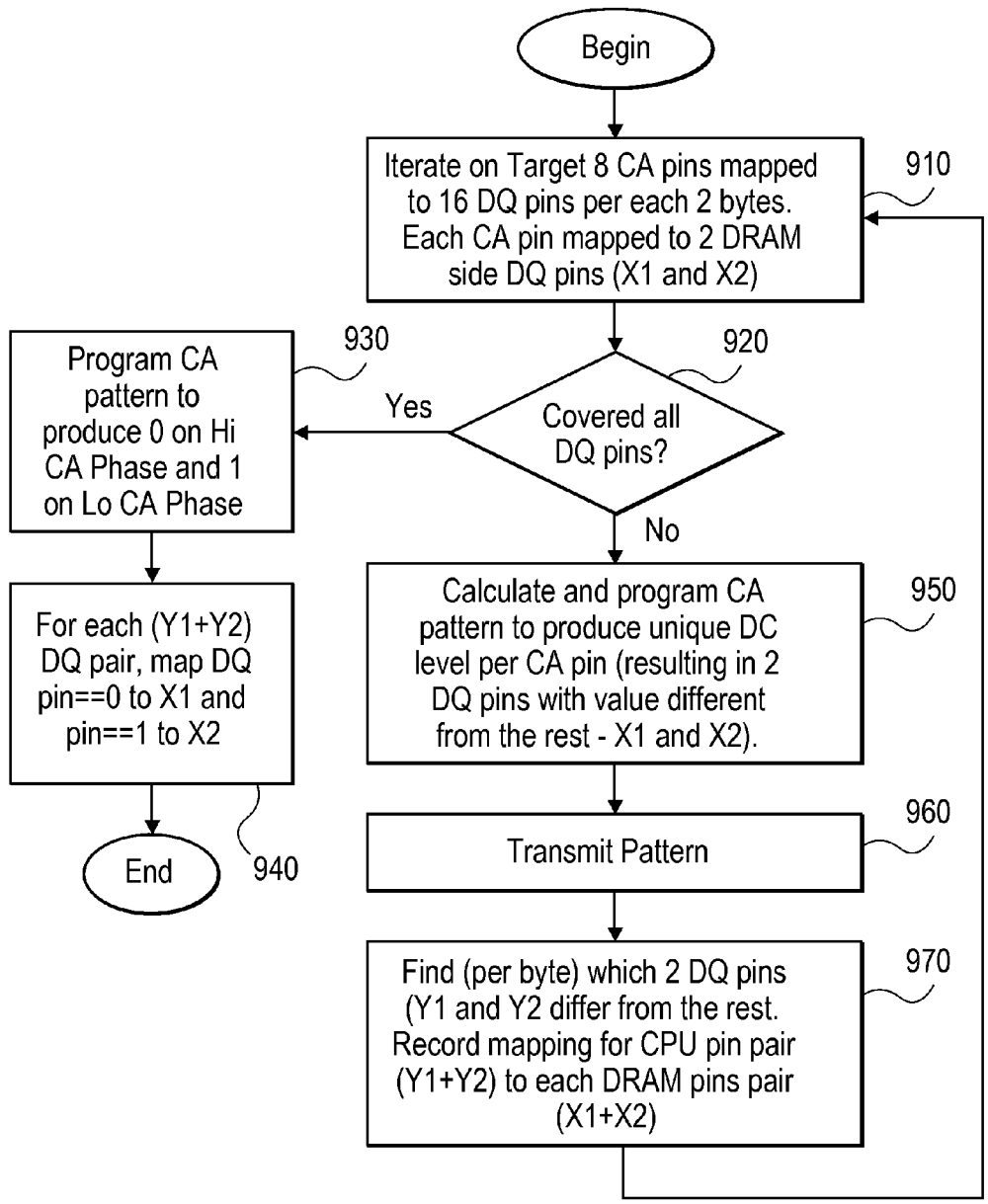
FIG. 9 is a flow diagram of one embodiment data pin mapping that can be used without pre-training.

FIG. 9 is a flow diagram of one embodiment data pin mapping that can be used without pre-training described on FIGS. 6 and 7. The procedure of FIG. 9 provides a technique to map data device pins (X1, X2, etc.) with processor pins (Y1, Y2, etc.), without the pre-training mechanisms discussed above.

In one embodiment, a pattern with one '1' bit and seven '0' bits is iterated on eight target CA pins mapped to 16 DQ pins for each two bytes, 910. Inversed pattern with one '0' and seven '1' bits will produce similar result. Each CA pin is mapped to two data device pins (e.g., X1 and X2). If all CA pins are covered, 920, a CA pattern is programmed to produce a '0' on one CA phase (e.g., high) and a '1' on the other CA phase (e.g., low) on all the CA pins concurrently, 930. In one embodiment, for each DQ pin pair (e.g., X1 and X2) the DQ pin with the '0' is mapped to a first pin (e.g., X1) and the DQ pin with the '1' is mapped to a second pin (e.g., X2), 940. Other similar patterns will produce identical outcome of mapped pins.

If all CA pins are not covered, 920, a CA pattern to produce a unique DC level per CA pin is calculated and programmed, 950. This results in two DQ pins with values that are different than the rest, which are X1 and X2. The pattern is transmitted, 960. The DQ pins that are different from the rest (Y1 and Y2) are found, 970. The mapping is recorded for the processor pin pair (Y1 and y2) for the corresponding data pin pair (X1 and X2).

Figure 10:
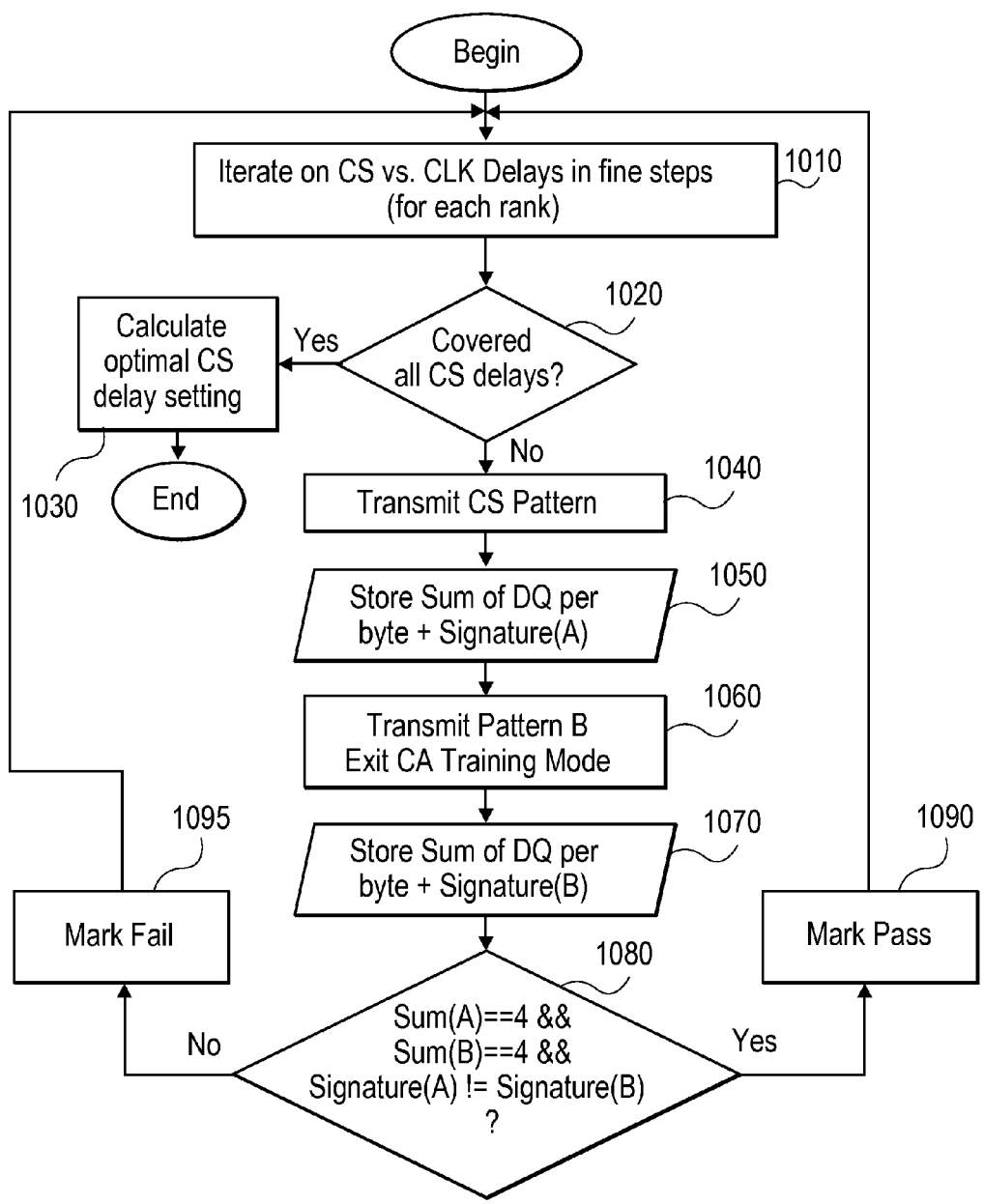
FIG. 10 is a flow diagram of one embodiment of a technique for CS training that can be used after DQ mapping.

FIG. 10 is a flow diagram of one embodiment of a technique for CS training that can be used after DQ mapping. In one embodiment, the CS vs. CLK delays are iterated, 1010. In one embodiment, the iterations are for each rank. If all CS delays are covered, 1020, the optimal CS delay setting is calculated, 1030. In one embodiment, another exit criteria might exist for 1020, such as finding a large enough passing range for CS vs. CLK delays without the need to iterate on all the possible CS vs. CLK delays.

If all CS delays are not covered, 1020, the first CS pattern is transmitted, 1040. The sum of the data bits for each byte of the first pattern is stored with a signature for the first pattern, 1050. The second CS pattern is transmitted, 1060. The sum of the data bits for each byte of the second pattern is stored with a signature for the second pattern, 1070.

The pattern results are compared, 1080, to determine whether the current timing parameters have passed, 1090, or failed, 1095. In one embodiment, the results comparison involves checking the number of '1' bits received for each training pattern. In one embodiment, if each pattern results in four '1' bits received (assuming the appropriate pattern from FIG. 3 or similar was used) and the signatures for the two patterns are different, the pattern training has passed.

In one embodiment, data line mapping is accomplished by detecting valid values on a command/address (CA) bus at a memory device. A first pattern is transmitted via a first subset of two or more data pins on the memory device corresponding to detecting the valid values on the CA bus. Signals are sampled from the data pins while the first pattern is being transmitted to obtain a first sample. A second pattern is transmitted via a second subset of two or more data pins on the memory device. Signals are sampled from the data pins while the second pattern is being transmitted to obtain a second sample. The first sample and the second sample are used to generate a data pin mapping In one embodiment, the memory device comprises a dynamic random access memory (DRAM). In one embodiment, the DRAM is a Low Power Double Data Rate 3 (LP-DDR3) compliant memory device. In one embodiment, the DRAM is a Double Data Rate (DDRx) compliant memory device. In one embodiment, the first subset comprises a first half of the data pins and the second subset comprises a second half of the data pins. In one embodiment, the first half comprises even numbered data pins and the second half comprises odd numbered data pins.

In one embodiment, a system includes at least one memory device having command/address (CA) pins and data pins and a memory controller coupled with at least one memory device via the CA pins and the data pins. The memory controller to transmit valid values on a command/address (CA) bus at a memory device, the memory device to transmit a first pattern via a first subset of two or more data pins on the memory device, the memory controller to receive sampled signals from the data pins while the first pattern is being transmitted to obtain a first sample, transmit a second pattern via a second subset of two or more data pins on the memory device, receive sampled signals from the data pins while the second pattern is being transmitted to obtain a second sample, and use the first sample and the second sample to generate a data pin mapping and/or pass/fail conclusion for training.

In one embodiment, the memory controller transmits a (single) pattern on CA pins and the memory device samples each CA pin twice and returns the result on even odd data pins accordingly. The memory device does not receive anything on the data bus in this case, though, only the memory controller does.

In one embodiment, the memory device comprises a dynamic random access memory (DRAM). In one embodiment, the DRAM is a Low Power Double Data Rate 3 (LP-DDR3) compliant memory device. In one embodiment, the DRAM is a Double Data Rate (DDRx) compliant memory device. In one embodiment, the first subset comprises a first half of the data pins and the second subset comprises a second half of the data pins. In one embodiment, the first half comprises even numbered data pins and the second half comprises odd numbered data pins.

In one embodiment, a system includes a memory controller and a memory device having command/address (CA) pins and data pins. The memory device coupled to communicate with the memory controller via the CA pins and the data pins, the memory device to detect valid values on a command/address (CA) bus at a memory device, receive a first pattern via a first subset of two or more data pins on the memory device, sample signals from the data pins while the first pattern is being transmitted to obtain a first sample in response to detecting the valid values on the CA bus, receive a second pattern via a second subset of two or more data pins on the memory device, sample signals from the data pins while the second pattern is being transmitted to obtain a second sample, send the first sample and the second sample to the memory controller. The memory controller generates a data pin mapping and/or pass/fail conclusion for training based on the first sample and the second sample.

In one embodiment, the memory device comprises a dynamic random access memory (DRAM). In one embodiment, the DRAM is a Low Power Double Data Rate 3 (LP-DDR3) compliant memory device. In one embodiment, the DRAM is a Double Data Rate (DDRx) compliant memory device. In one embodiment, the first subset comprises a first half of the data pins and the second subset comprises a second half of the data pins. In one embodiment, the first half comprises even numbered data pins and the second half comprises odd numbered data pins.

A memory device includes command/address (CA) pins, data pins and control logic coupled with the CA pins and the data pins. The control logic to detect valid values on a command/address (CA) bus at a memory device, receive a first pattern via a first subset of two or more data pins on the memory device, sample signals from the data pins while the first pattern is being transmitted to obtain a first sample in response to detecting the valid values on the CA bus, receive a second pattern via a second subset of two or more data pins on the memory device, sample signals from the data pins while the second pattern is being transmitted to obtain a second sample, send the first sample and the second sample to the memory controller.

In one embodiment, the memory device comprises a dynamic random access memory (DRAM). In one embodiment, the DRAM is a Low Power Double Data Rate 3 (LP-DDR3) compliant memory device. In one embodiment, the DRAM is a Double Data Rate (DDRx) compliant memory device. In one embodiment, the first subset comprises a first half of the data pins and the second subset comprises a second half of the data pins. In one embodiment, the first half comprises even numbered data pins and the second half comprises odd numbered data pins.

In one embodiment, a memory controller includes command/address (CA) pins, data pins and control logic coupled with the CA pins and the data pins. The memory controller to communicate with at least one memory device via the CA pins and the data pins, the memory controller to transmit valid values on a command/address (CA) bus at a memory device, receive sampled signals from the data pins while the first pattern is being transmitted to obtain a first sample, transmit a second pattern via a second subset of two or more data pins on the memory device, receive sampled signals from the data pins while the second pattern is being transmitted to obtain a second sample, and use the first sample and the second sample to generate a data pin mapping and/or pass/fail conclusion for training.

In one embodiment, the memory device comprises a dynamic random access memory (DRAM). In one embodiment, the DRAM is a Low Power Double Data Rate 3 (LP-DDR3) compliant memory device. In one embodiment, the DRAM is a Double Data Rate (DDRx) compliant memory device. In one embodiment, the first subset comprises a first half of the data pins and the second subset comprises a second half of the data pins. In one embodiment, the first half comprises even numbered data pins and the second half comprises odd numbered data pins.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   detecting valid values on a command/address (CA) bus at a memory device;
   transmitting, with a memory controller, a first pattern on the CA bus resulting in DRAM transmitting a first set of values on the Data pins producing a unique sum of '1'-s per byte
   sampling signals from the data pins after the first pattern is being transmitted to obtain a first sample;
   transmitting, with the memory controller, a second pattern on the CA bus resulting in DRAM transmitting a second set of values on the Data pins producing a unique sum of '1'-s per byte
   sampling signals from the data pins after the second pattern is being transmitted to obtain a second sample;
   using the first sample and the second sample to generate a data pin mapping.

2. The method of claim 1 further comprising using the first sample and the second sample to achieve CLK/CS/CA rough resolution pre-training and CS fine resolution training.

3. The method of claim 1 wherein the memory device comprises a dynamic random access memory (DRAM).

4. The method of claim 3 wherein the DRAM is a Low Power Double Data Rate 3 (LPDDR3) compliant memory device.

5. The method of claim 3 wherein the DRAM is a Double Data Rate (DDRx) compliant memory device.

6. The method of claim 1 wherein the first subset comprises a first half of the data pins and the second subset comprises a second half of the data pins.

7. The method of claim 6 wherein the first half comprises even numbered data pins and the second half comprises odd numbered data pins.

8. A system comprising:
   at least one memory device having command/address (CA) pins and data pins;
   a memory controller coupled with the at least one memory device via the CA pins and the data pins, the memory controller to transmit valid values on a command/address (CA) bus at a memory device, transmit a first pattern on the CA bus, receive sampled signals from the data pins after the first pattern is being transmitted to obtain a first sample, transmit a second pattern on the CA bus, receive sampled signals from the data pins while the second pattern is being transmitted to obtain a second sample, and use the first sample and the second sample to generate a data pin mapping.

9. The system of claim 8 wherein the memory device comprises a dynamic random access memory (DRAM).

10. The system of claim 9 wherein the DRAM is a Low Power Double Data Rate 3 (LPDDR3) compliant memory device.

11. The system of claim 9 wherein the DRAM is a Double Data Rate (DDRx) compliant memory device.

12. A system comprising:
    a memory controller;
    a memory device having command/address (CA) pins and data pins, the memory device coupled to communicate with the memory controller via the CA pins and the data pins, the memory device to detect valid values on a command/address (CA) bus at a memory device, receive a first pattern via a first subset of two or more data pins on the memory device, sample signals from the data pins while the first pattern is being transmitted to obtain a first sample in response to detecting the valid values on the CA bus, receive a second pattern via a second subset of two or more data pins on the memory device, sample signals from the data pins while the second pattern is being transmitted to obtain a second sample, send the first sample and the second sample to the memory controller;
    wherein the memory controller generates a data pin mapping based on the first sample and the second sample.

13. The system of claim 12 wherein the memory device comprises a dynamic random access memory (DRAM).

14. The system of claim 12 wherein the DRAM is a Low Power Double Data Rate 3 (LPDDR3) compliant memory device.

15. The system of claim 12 wherein the DRAM is a Double Data Rate (DDRx) compliant memory device.

16. The system of claim 12 wherein the first subset comprises a first half of the data pins and the second subset comprises a second half of the data pins.

17. The system of claim 12 wherein the first half comprises even numbered data pins and the second half comprises odd numbered data pins.

18. A memory controller comprising:
    command/address (CA) pins;
    data pins; and
    control logic coupled with the CA pins and the data pins, the memory controller to communicate with the at least one memory device via the CA pins and the data pins, the memory controller to transmit valid values on a command/address (CA) bus at a memory device, transmit a first pattern via a first subset of two or more data pins on the memory device, receive sampled signals from the data pins while the first pattern is being transmitted to obtain a first sample, transmit a second pattern via a second subset of two or more data pins on the memory device, receive sampled signals from the data pins while the second pattern is being transmitted to obtain a second sample, and use the first sample and the second sample to generate a data pin mapping.

19. The memory controller of claim 18 wherein the memory device comprises a dynamic random access memory (DRAM).

20. The memory controller of claim 18 wherein the DRAM is a Low Power Double Data Rate 3 (LPDDR3) compliant memory device.

21. The memory controller of claim 18 wherein the DRAM is a Double Data Rate (DDRx) compliant memory device.

* * * * *